US008270628B2

(12) United States Patent
Evert et al.

(10) Patent No.: US 8,270,628 B2
(45) Date of Patent: Sep. 18, 2012

(54) METHOD AND SYSTEM FOR ACTIVELY INFLUENCING NOISE, AND USE THEREOF IN A MOTOR VEHICLE

(75) Inventors: Fabian Evert, Germering (DE); Roland Lippold, Dresden (DE); Rolf Schirmacher, Germering (DE); Florian Walter, Pforzheim (DE)

(73) Assignee: Müller-BBM, Planegg (DE)

( * ) Notice: Subject to any disclaimer, the term of this patent is extended or adjusted under 35 U.S.C. 154(b) by 1050 days.

(21) Appl. No.: 12/097,715

(22) PCT Filed: Jun. 23, 2006

(86) PCT No.: PCT/EP2006/063514

§ 371 (c)(1), (2), (4) Date: Sep. 3, 2008

(87) PCT Pub. No.: WO2007/071458

PCT Pub. Date: Jun. 28, 2007

(65) Prior Publication Data

US 2009/0205903 A1 Aug. 20, 2009

(30) Foreign Application Priority Data

Dec. 15, 2005 (DE) ......................... 10 2005 060 064

(51) Int. Cl.
*H03B 29/00* (2006.01)

(52) U.S. Cl. ....... 381/71.4; 381/71.1; 181/206; 181/296

(58) Field of Classification Search ........ 381/71.1–71.5, 381/86; 704/226, 233; 181/206, 296
See application file for complete search history.

(56) References Cited

U.S. PATENT DOCUMENTS

2002/0168071 A1* 11/2002 Daly ............................ 381/71.4
2003/0048677 A1* 3/2003 Muneno ........................ 365/200
2004/0086135 A1* 5/2004 Vaishya ....................... 381/71.4
2007/0003071 A1* 1/2007 Slapak et al. ................ 381/71.1

FOREIGN PATENT DOCUMENTS

DE 196 32 230 A1 2/1998
DE 199 24 482 A1 12/1999
JP 06-109069 A 4/1994

* cited by examiner

*Primary Examiner* — Goins Davetta
*Assistant Examiner* — Disler Paul
(74) *Attorney, Agent, or Firm* — Sughrue Mion, PLLC

(57) ABSTRACT

Method for influencing noise, wherein a noise source (16), in particular an engine in a motor vehicle, generates the noise with a substantially periodically variable excitation, and wherein a reference variable which is characteristic of the noise source, in particular an engine speed, is present at predetermined successive supply instants ($t_i$), comprising the method steps; reading out at least a first value ($N_{i-1}$) of the reference variable at a first supply instant ($t_{i-1}$) and a second predetermined value at a second supply instant ($t_i$); generating the reference signal (12) at at least one instant (t) between the second supply instant ($t_i$) and a third supply instant ($t_{i+1}$) as a function of the first and second values that were read out; and sending the reference signal (12) to a device for actively influencing noise (11), which generates activation signals (13) for at least one actuator (14) as a function of the reference signal (12), wherein the at least one actuator (14) emits compensation sound, which interferes with the noise.

18 Claims, 3 Drawing Sheets

METHOD AND SYSTEM FOR ACTIVELY INFLUENCING NOISE, AND USE THEREOF IN A MOTOR VEHICLE

BACKGROUND OF THE INVENTION

The present invention relates to a method for actively influencing noise, in particular in a motor vehicle. The invention also relates to a corresponding system and the use thereof in a motor vehicle.

Systems for actively influencing noise, which are also called ANC systems (active noise control), are used, for example, in a passenger compartment of a motor vehicle to reduce the noise level of a source of disturbance, for example from the engine, by introducing controlled acoustic signals. In this active compensation, the noise is reduced by superimposition of additional vibrations, so-called anti-noise. It is also possible to amplify any desired harmonics and/or the fundamental tone of the primary noise by the controlled introduction of secondary sound. Ordinarily, harmonic tone sequences are perceived as pleasant, for example. By predetermined suppression of individual frequencies of the engine noise and amplifying other frequencies, a perceived engine noise can be configured in a predetermined manner, for example. This is then also referred to as sound design.

Compensation sound is taken below to mean secondary sound that is introduced additionally to the noise and that can act in an amplifying manner and also in an attenuating manner at certain sound frequencies.

The same principle emerges in the compensation of solid-borne sound, with counter-vibrations being introduced in a solid body by means of actuators and these counter-vibrations causing a reduction in noise or a change in the noise.

Generally, the sound sources or vibration sources are substantially periodic sound sources. The excitation frequency of the noise source which is derived from the periodicity is in this case used as an input variable for an adaptive control of the noise reduction system. If this variable which is characteristic of the respective noise source changes with respect to time, an adaptive controller of the noise reduction system carries out a corresponding adaptation in the compensation noise introduction.

An adaptive control for active noise reduction is known, for example, from DE 196 32 230 C2. A reference signal generator is provided there, which detects an engine speed and generates an electronic reference signal having information about the engine speed. This may, for example, be a pulse signal, which is guided via signal lines to a sine-wave generator provided in the noise reduction system. In the motor vehicle, a corresponding reference signal may also be derived from the ignition coil signal, which is directly linked with the engine speed and therefore the acoustic excitation frequency of the engine.

It is necessary in active noise reduction systems to hold in readiness the corresponding excitation frequency or an equivalent reference signal for the activation of the actuators or compensation loudspeakers as continuously with respect to time as possible. In noise reduction systems according to the prior art, a measurement sensor generally used close to the engine and providing a corresponding reference signal to the actual controller of the noise reduction system is therefore provided. In this case, the noise reduction system is generally arranged in the passenger compartment, so long signal paths and corresponding cabling are necessary.

Because of progressing automation and the integration of various control tasks in modern systems in a digital manner, analogue time-continuous monitoring signals are scarcely still available. In modern motor vehicles, the data communication takes place, for example, by means of digital bus systems, such as, for example the CAN bus (Controller Area Network Bus). Real time data communication is no longer possible in such asynchronous serial bus systems. To display the engine speed in the dashboards of a motor vehicle, a supply rate of only 10 times per second is sufficient, for example.

Typically, a plurality of bus systems is provided in current motor vehicles. A first high speed bus is provided in this case in the engine compartment which networks the engine control and has a supply period for the engine speed in the order of magnitude of 10 to 20 milliseconds. A second slower data bus, which is coupled via a gateway to the high speed bus, is used to network control apparatuses for comfort and interior functions of the motor vehicle, such as, for example, speedometer, rev counter etc.

The important reference variable of the engine speed for a system for actively influencing noise is therefore only available, however, at a lower supply rate of about 10 times per second, in other words every 100 milliseconds on the slower data bus, which is provided in the interior of the motor vehicle. The reference variable which is only present in a very rough time-discrete manner, such as the engine speed, makes operation of the active system in the passenger compartment more difficult, in particular when accelerating and braking the engine.

It is therefore an object of the present invention to provide a reliable method for influencing noise. It is an object of the invention to provide a system for actively influencing noise.

SUMMARY OF THE INVENTION

This object is achieved by a method for influencing noise according to claim 1 and by a system for actively influencing noise with the features of claim 10.

Further configurations of the invention emerge from the sub-claims.

One aspect of the invention is to provide a method for influencing noise, preferably where a reference variable characterising the respective noise source is only present in samples which are spaced apart with respect to time.

According to one aspect of the invention, the characteristic reference variable present in a time-discrete manner is extrapolated proceeding from the respective readout instants, at least two values of the reference variable which have been read out beforehand with respect to time being used in an extrapolation model, or a value of the reference variable which has been read out and a change parameter of the reference variable being used for an extrapolation. The reference signal generated in the method according to the invention is thus present practically time-continuously. At least it is present at a sampling rate, with which a digital system for influencing noise is operated. This allows reliable adaptation of the compensation noise introduction by the device for actively influencing noise to the excitation changing with respect to time of the noise source.

In this case, “substantially periodic” is taken to mean that the excitation frequency during operation of the noise source may change, such as is the case, for example, in an engine during acceleration or deceleration.

In the method according to the invention and the system according to the invention for influencing noise, the current actual excitation characterised by the reference variable is always taken into account in the compensation sound introduction control. The invention therefore makes it possible to irradiate secondary sound or compensation sound with particularly high amplitude and phase precision.

The method according to the invention allows a system for actively influencing noise to be coupled directly to a data bus present for example in the interior of the vehicle, said data bus only having a low repetition rate with regard to the characteristic reference variable. Thus, an additional measurement sensor to receive the reference variable and the corresponding cabling are not necessary.

The proposed method and system according to the invention for influencing noise is particularly suitable for use in a motor vehicle, in which, for an improved extrapolation model, further data can be taken into account to predict the engine speed between readouts from the data bus. The invention can also be simply implemented in programmable digital control devices of the active system for influencing noise.

Advantageous configurations and developments of the invention are the subject of the sub-claims and the description with reference to the accompanying figures.

The invention will be described in more detail below using a preferred embodiment of an adaptive system for influencing noise in a motor vehicle. In the drawings:

BEST MODE FOR CARRYING OUT THE INVENTION

Figure 1:
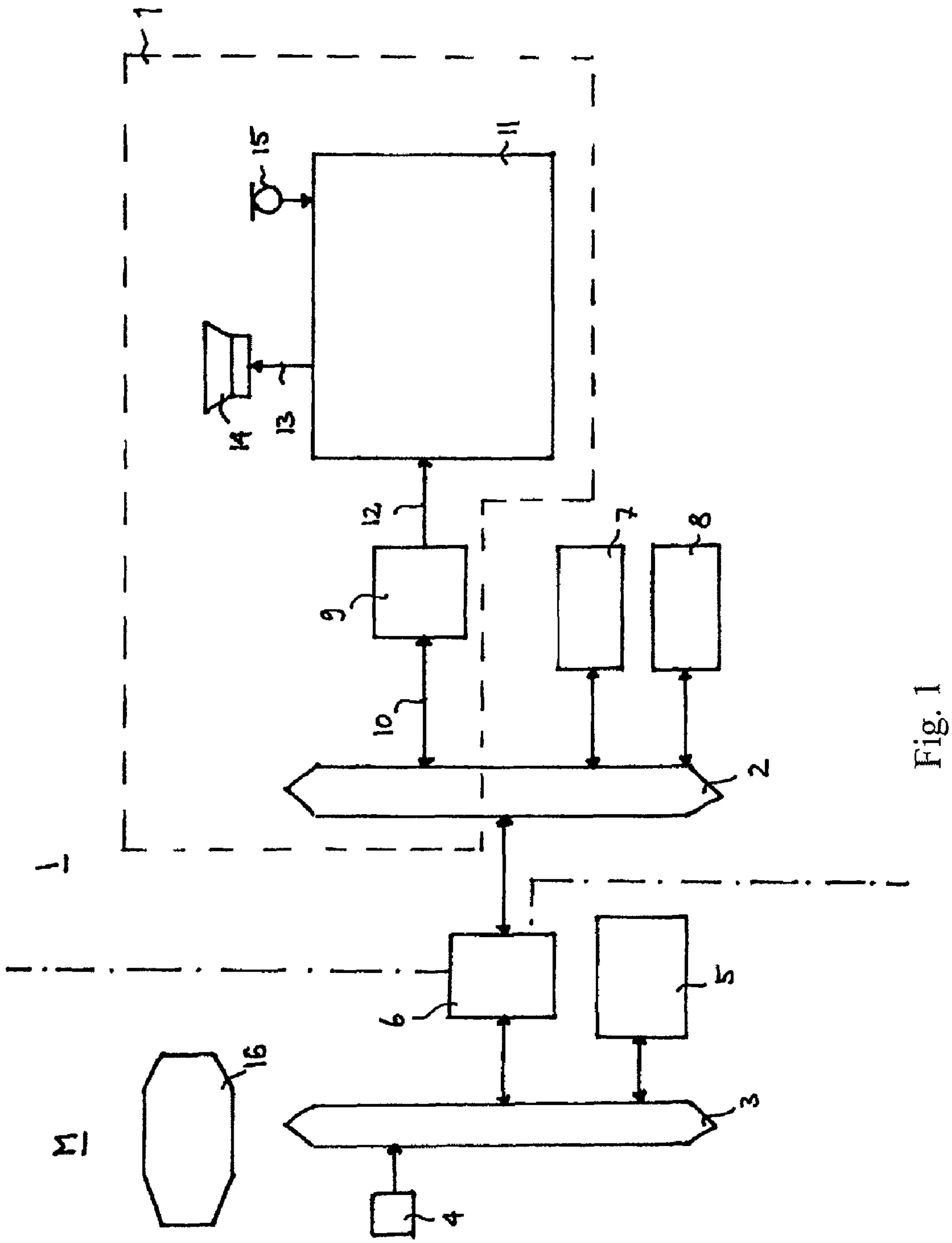
FIG. 1 shows a schematic view of a system according to the invention for influencing noise in a motor vehicle.

FIG. 1 shows a system for influencing noise 1 according to the invention, which is coupled to a data bus 2 in a motor vehicle.

Provided in the engine compartment M of the motor vehicle is a high speed CAN BUS 3, which is used for networking the engine control devices 4, 5. One of the engine control devices is, for example, a rotational speed sensor 4, which supplies information about the speed of the engine 16 to the high speed bus 3. A further engine control device 5 reads out the engine speed and other vehicle operating data from the high speed bus 3 and sends corresponding control signals for the engine 16 to the high speed bus 3. A signal representing the engine speed is thus generally present at a supply rate of 10 to 20 milliseconds on the high speed bus 3.

A low speed CAN bus 2 which is coupled via a gateway device 6 to the high speed CAN bus 3 is provided in the vehicle interior I which is shown on the right-hand side of the dot-dash line in FIG. 1. Coupled to the low speed CAN bus 2 are, for example, display devices 7 for displaying speed, rotational speed, fuel level or other common monitoring variables, as well as control regulators 8 for comfort functions of the vehicle.

The rotational speed information which is a characteristic reference variable that is characteristic for the noise source, for example the engine 16, is only present on the low speed CAN bus 2 at a repetition rate of about 100 milliseconds. In other words, at supply instants spaced apart by 100 milliseconds, current rotational speed information can be read out. Furthermore, further delays may occur through the signal running times between the high speed CAN bus 3, the gateway 6 and the low speed CAN bus 2. The supply instants may therefore be irregularly spaced apart.

The system for influencing noise 1 has an extrapolation device 9 which is coupled via suitable data lines 10 to the low speed CAN bus 2 provided in the vehicle interior. A device for actively influencing noise 11 is also provided and accepts a reference signal 12 generated by the extrapolation device 9. The device for influencing noise 11 supplies control signals 13 to one or more actuators 14 which are shown here by way of example as a loudspeaker 14. A noise sensor or microphone 15 is also coupled to the device for influencing noise 11 and receives the noise which is emitted from the engine 16 as the noise source in the example shown, as well as the compensation signal or the compensation sound emitted by the loudspeaker 15.

The device for influencing noise 11 regulates the irradiation of the compensation sounds by the loudspeaker 14 based on (a) the reference signal 12, which is associated with a reference variable which characterises the noise source, for example the engine speed, and (b) the noise level recorded by the microphone. The irradiation of the compensation sounds is regulated in such a way that a noise change occurs owing to the interference of the noise and the irradiated secondary or compensation sound. In this case, the changed sound that is perceived, for example, by a passenger, can be configured in such a way that the noise is perceived as pleasant. In this case, higher harmonics derived from the excitation frequency of the noise source, in other words the fundamental frequency, can also be attenuated or amplified in a predetermined manner by irradiating a secondary sound, so that a desired noise characteristic occurs. In this case, not only integer-multiple harmonic excitations can be varied by the secondary sound introduction, but any harmonics can be influenced to achieve a desired sound design.

Figure 2:
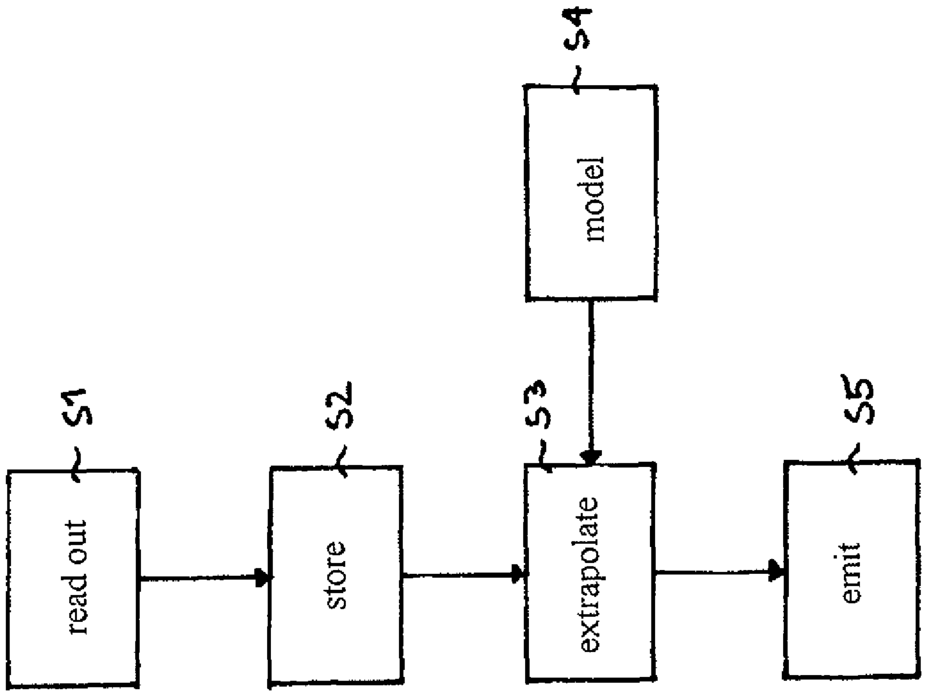
FIG. 2 shows a flow chart of the method according to the invention.

If the engine speed, as the reference variable, changes, for example on acceleration or deceleration of the vehicle, the device for influencing noise 11 requires a corresponding current reference signal 12 essentially in real time to adapt the compensation sound integration to the changed excitation frequency of the engine 16. However, the reference variable is only present at certain supply instants at the low speed CAN bus 2. The extrapolation device 9 therefore carries out the method steps described in more detail in FIG. 2.

The extrapolation device 9, in a first step S1 at a first supply instant $t_1$, reads out the present engine speed $N_1$ and stores it in a second step S2. The reading out and storage in each case takes place at successive supply instants $t_i$, which are predetermined by the state and the architecture of the data bus, for example the low speed CAN bus 2.

Using an extrapolation model S4, the extrapolation device 9 extrapolates, in step S3, the values of the rotational speeds which have been read out and stored and generates a corresponding reference signal 12, which is output in step S5. In this case, the reference signal 12 is generated in such a way that the respective values of the reference signal 12 approximate as well as possible the current reference value between the supply instants $t_i$.

A particular example of an extrapolation model provides a linear extrapolation by means of an excitation frequency/time gradient or engine speed/time gradient. At the supply instants $t_i$ and $t_{i-1}$, the engine speed values $N_i$ and $N_{i-1}$ are read out. The time difference between the supply instants $t_i$, $t_{i-1}$ is $\Delta t=t_i-t_{i-1}$. Between these two instants $t_i$, $t_{i-1}$, the engine speed changes by $\Delta N=N_i-N_{i-1}$.

The extrapolation device 9 determines this change of the reference variable or the engine speed and calculates the rotational acceleration produced therefrom as:

$$\dot{N} = \frac{\Delta N}{\Delta t}.$$

The rotational speed can be linearly extrapolated in principle for any instants $t>t_i$:

$$N(t>t_i)=N_i+\dot{N}(t-t_i) \quad \text{(G1. I)}$$

The extrapolation device 9 supplies this estimated engine speed N(t) as a reference signal 12 to the device for influencing noise 11. The extrapolation device 9 supplies this reference signal 12 at a reference signal rate which corresponds, for example, to the clock rate of the device for influencing noise 11. Conventional rates are for example in the order of magnitude of 1-5 kHz.

Apart from a linear extrapolation, further modified extrapolation methods are also possible. For example, a plurality of values of the engine speed, which have been read out previously with respect to time, may be taken into account and higher order extrapolation polynomials may be used.

A refined modelling of the noise source in the application example of the engine described here may also take place by taking into account further engine-related parameters, such as the current load or variations in the engine behaviour, which are caused by an engine control. In this case, the pedal dynamics of the acceleration and/or brake pedal, control signals of an anti-lock system or electronic stabilising system or other data may be taken into account. The data required for corresponding models are available in the vehicle via the digital data bus systems.

Other extrapolation models that may be used comprise self-learning models, in other words models, in which adaptations in the respective extrapolation algorithm, for example owing to changing extrapolation parameters, take place during operation. During the extrapolation, known properties about the noise source or the control thereof, for example an engine control, may also be taken into account. For example, engines are frequently automatically shut down at specific particularly high speeds. Knowledge of this type is advantageously taken into account in the extrapolation.

When calculating the rotational speed data in advance, the signal running time for example between the rotational speed sensor 4 via the high speed CAN bus 3, the gateway 6 and the low speed data bus 2 may also be taken into account. This way, a further improvement in the extrapolated engine speed or the values of the reference signal 12 may be achieved and a reference signal value that is closer to the value of the actually present reference variable may be achieved.

In an alternative embodiment of the method according to the invention, the actual values of the reference variable are also extrapolated by using a change parameter, which characterises the time change of the reference variable, and a value of the reference variable which has been read out, if a corresponding change parameter, such as, for example, the rotational acceleration $\dot{N}$, can be read out at the data bus. In principle, the invention merely requires any parameters which can be read out and are spaced apart with respect to time, and which allow an extrapolation to be carried out. Supply instants for a corresponding change parameter and the supply instants for the values of the reference variable possibly may lie closer together with respect to time than the supply instants for the values of the reference variable.

Figure 3:
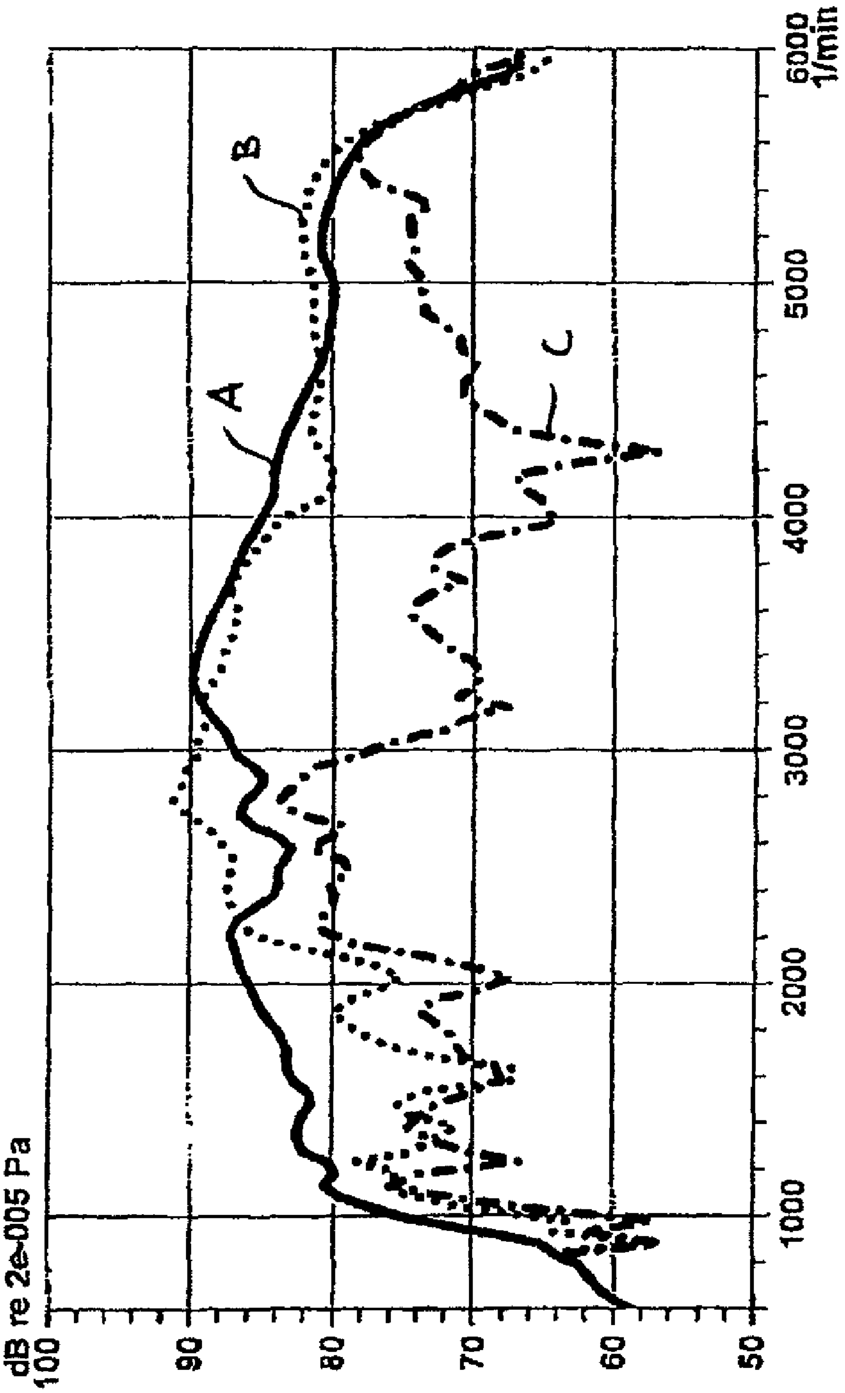
FIG. 3 shows a graph with sound pressure levels as a function of the engine speed.

Sound levels obtained when using the method and system according to the invention for actively influencing noise are shown in FIG. 3 as a function of an engine speed. The adaptive control as a function of the generated reference signal is described in more detail for example in DE 196 32 230 C2 and in the example observed here is used for noise reduction.

The curve A shown by a solid line represents the sound pressure level without an active system for influencing noise in a four-cylinder engine at a microphone in a vehicle interior for the ignition frequency, in other words twice the engine speed. The engine speed was in this case ramped up within 60 seconds from 1,000 revolutions per minute to 6,000 revolutions per minute.

The dotted curve B represents the sound pressure using an ANC system, in which the supply instants for updating the engine speed are spaced apart with respect to time by 100 milliseconds and no extrapolation according to the invention was carried out. In other words, the engine speed was assumed to be constant between the supply instants. In particular at rotational speeds from about 2,000 revolutions per minute, the slow updating caused mainly by the low supply rate of the low speed CAN bus is no longer sufficient to achieve a noise reduction with an ANC system.

The dash-dot line shows the noise pressure level using the method according to the invention for influencing the noise, a linear extrapolation of the engine speed having been carried out according to Equation 1 to generate the reference signal. In this case, the supply instants $t_i$ are in each case 100 milliseconds apart. The method according to the invention or the use of a system according to the invention for influencing noise substantially improves the active noise reduction over the entire rotational speed range.

The present invention therefore supplies a method for the reliable influencing of noise, in which precise information about the actually present excitation frequency of a noise source is supplied to an active device for influencing noise. The system according to the invention, on the basis of the method according to the invention, supplies particularly efficient influencing of noise although a reference variable characterising the respective noise source is only present as a sample.

A particular advantage of the present invention is that no additional measurement value sensor has to be provided and the system can be coupled directly to a data bus.

Although the present invention was described in more detail using a preferred embodiment, it is not restricted thereto, but may be modified in various ways. Said supply rates and data bus protocols are only to be understood by way of example. An irregular supply of the reference variable is also possible. Secondary sound or noise may also be irradiated outside the vehicle interior, for example by loudspeakers in the exhaust gas system or in the air intake filter.

The invention is not limited to use in a motor vehicle, but may preferably be used whenever periodic noise excitations are present. This may also be the case, for example, in motor-driven ventilators, pumps, pump compressors or other mechanisms. Switching frequencies in certain power electronics, which can be queried with the data bus, can also be used as a possible reference variable.

Furthermore, the method according to the invention or the extrapolation device and the device for influencing noise may be fully computer-implemented. To this extent, a programmable microcontroller device is conceivable, for example, which carries out the method according to the invention in the programmed state.

Although the invention has been described using the example of introducing vibration in air as a fluid medium, an application for varying solid-borne sound is just as possible.

List Of Reference Numerals

1 system for actively influencing noise

2 low speed data bus

3 high speed data bus
4 rotational speed sensor
5 engine control
6 gateway
7 display device
8 control regulator
9 extrapolation device
10 data line
11 device for actively influencing noise
12 reference signal
13 activation signals
14 actuator
15 microphone
16 engine

The invention claimed is:

1. A method for influencing noise, wherein a noise source generates the noise with a substantially periodic variable excitation, and wherein a reference variable which is characteristic of the noise source, is supplied at successive supply instants ($t_i$), comprising the method steps:

reading out at least a first value ($N_{i-1}$), of the reference variable at a first supply instant ($t_{i-1}$) and a second predetermined value at a second supply instant ($t_i$);

generating a reference signal at at least one instant (t) between the second supply instant ($t_i$) and a third supply instant ($t_{i+1}$) as a function of the first and second values that were read out;

supplying the reference signal to a device for actively influencing noise, which generates activation signals for at least one actuator as a function of the reference signal, wherein the at least one actuator emits compensation sound, which interferes with the noise; and determining the change (ΔN) of the reference variable between the first supply instant ($t_{i-1}$) and the second supply instant ($t_i$);

wherein the reference signal is extrapolated as a function of the value ($N_i$) of the reference variable read out at the second supply instant (Ti) and of the change (ΔN) of the reference variable.

2. The method according to claim 1, wherein a change parameter (N) of the reference variable or a second value ($N_i$) of the reference variable is read out as the second value and the reference signal is extrapolated as a function of the first value ($N_{i-1}$) of the reference variable and the second value.

3. The method according to claim 1, wherein the reference signal is obtained by linear extrapolation.

4. The method according to claim 1, wherein the reference signal is obtained by extrapolation based on further values of the reference variable at further supply instants.

5. The method according to claim 1, wherein the reference signal is obtained by extrapolation based on further characteristic variables that are characteristic for the noise source.

6. The method according to claim 1, wherein the reference variable is an engine speed or an engine excitation frequency engine.

7. The method according to claim 1, wherein a delay time between an instant of a change of the reference variable and a respective supply instant, in particular through signal running times between a measurement sensor and a data bus supplying the reference variable is taken into account for the extrapolation.

8. The method according to claim 1, wherein the compensation sound is emitted in such a way that harmonics of the sound source derived from the periodic excitation are at least partially amplified and/or attenuated.

9. The method according to claim 1, wherein the noise source is an engine in a motor vehicle.

10. A system for actively influencing noise for varying noise, which is generated by a noise source with a substantially periodic variable excitation frequency, the system comprising:

a data bus, at which a reference variable, which characterises the respective excitation frequency of the noise source, can be read out at predetermined supply instants ($t_i$);

an extrapolation device which is coupled to the data bus and generates a reference signal, which is associated with the reference variable, at a reference signal rate, respective values of the reference signal being obtained by extrapolation of the reference variable at a plurality of the supply instants ($t_i$), wherein the extrapolation device determines the change (ΔN) of the reference variable between a first supply instant ($t_{i-1}$) and a second supply instant ($t_i$) and extrapolates the reference signal as a function of a value ($N_i$) of the reference variable read out at a second supply instant ($T_i$) and of the change (ΔN) of the reference variable; and a device for actively influencing noise, which generates activation signals for at least one actuator based on the reference signal, wherein the at least one actuator emits compensation sound, which interferes with the noise.

11. The system according to claim 10, wherein a change parameter (N) of the reference variable can furthermore be read out at the data bus, the extrapolation device extrapolating the reference variable as a function of at least one value ($N_i$) that has been read out, of the reference variable and the change parameter (N).

12. The system according to claim 10, wherein during generation of the reference signal, signal running times owing to the reading out of the reference variable and/or a delay owing to supply of the reference variable are also taken into account on the data bus.

13. The system according to claim 10, wherein the data bus is configured as a CAN bus.

14. The system according to claim 10, wherein at least one of the extrapolation device and the device for actively influencing noise is configured as a digital signal processing device.

15. The system according to claim 10, wherein the device for actively influencing noise generates the control signals in such a way that harmonics of the noise source derived from the periodic Vibration excitation are at least partially amplified and/or attenuated by the compensation sound.

16. A use of a system for actively influencing noise according to claim 10 in a motor vehicle, wherein the noise source is an engine, the reference variable is an engine speed, and the data bus is configured as a CAN bus for an engine control and for monitoring an engine State.

17. The use according to claim 16, wherein data for engine control including at least one of acceleration values, pedal positions, pedal movements and/or shifting parameters, are used as further variables characterising the noise source.

18. The use according to claim 16, wherein a first high speed CAN bus provided in an engine compartment and a second low speed CAN bus provided in a passenger compartment, are provided in the motor vehicle, the reference valuable and/or the further variables characterising the noise source being read out from the low speed CAN bus.

* * * * *